United States Patent
Yamada et al.

(10) Patent No.: US 8,008,190 B2
(45) Date of Patent: Aug. 30, 2011

(54) METHOD OF MANUFACTURING SEMICONDUCTOR DEVICE

(75) Inventors: Nobuhide Yamada, Yokkaichi (JP);
Hideto Matsuyama, Yokohama (JP);
Hideshi Miyajima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 140 days.

(21) Appl. No.: 12/142,858

(22) Filed: Jun. 20, 2008

(65) Prior Publication Data

US 2008/0318408 A1 Dec. 25, 2008

(30) Foreign Application Priority Data

Jun. 21, 2007 (JP) ................... 2007-163686

(51) Int. Cl.
*H01L 21/4763* (2006.01)
(52) U.S. Cl. .. 438/637; 438/639; 438/787; 257/E21.577
(58) Field of Classification Search .................. 438/637, 438/638, 639, 787; 257/E21.577
See application file for complete search history.

(56) References Cited

U.S. PATENT DOCUMENTS

| 5,703,404 | A | * | 12/1997 | Matsuura | 257/758 |
| 5,763,018 | A | * | 6/1998 | Sato | 427/535 |
| 6,207,585 | B1 | * | 3/2001 | Hasegawa et al. | 438/763 |
| 6,521,547 | B1 | | 2/2003 | Chang et al. | |
| 6,593,548 | B2 | * | 7/2003 | Matsumura et al. | 219/390 |
| 6,833,322 | B2 | * | 12/2004 | Anderson et al. | 438/680 |
| 7,135,402 | B2 | | 11/2006 | Lin et al. | |
| 2006/0128163 | A1 | | 6/2006 | Chen et al. | |
| 2008/0003775 | A1 | | 1/2008 | Yamada et al. | |
| 2008/0009143 | A1 | | 1/2008 | Yamada et al. | |

FOREIGN PATENT DOCUMENTS

| JP | 11-054504 | 2/1999 |
| JP | 2006-104418 | 4/2006 |
| JP | 2007-508691 | 4/2007 |
| WO | WO 2005-034194 A3 | 4/2005 |

OTHER PUBLICATIONS

Notification of Reason(s) for Refusal mailed Jul. 28, 2009, from the Japanese Patent Office in corresponding Japanese Patent Application No. 2007-163686, and English language translation thereof.

* cited by examiner

*Primary Examiner* — Michael Trinh
(74) *Attorney, Agent, or Firm* — Finnegan, Henderson, Farabow, Garrett & Dunner, L.L.P.

(57) ABSTRACT

Disclosed is a method of manufacturing a semiconductor device which includes: providing an insulating film formed above a semiconductor substrate with a processed portion; supplying a surface of the processed portion of the insulating film with a primary reactant from a reaction of a raw material including at least a Si-containing compound; and subjecting the primary reactant to dehydration condensation to form a silicon oxide film on the surface of the processed portion.

5 Claims, 6 Drawing Sheets

METHOD OF MANUFACTURING SEMICONDUCTOR DEVICE

CROSS-REFERENCE TO RELATED APPLICATION

This application is based on and claims the benefit of priority from the prior Japanese Patent Application No. 2007-163686, filed on Jun. 21, 2007, the entire contents of which are incorporated herein by reference.

BACKGROUND OF THE INVENTION

1. Field of the Invention

The present invention relates to a method of manufacturing a semiconductor device, the method including planarization of the surface of a processed portion of an insulating film formed above a semiconductor substrate.

2. Description of the Related Art

In the formation of the damascene interconnection, the insulating film such as a silicon oxide film is processed using the reactive ion etching (RIE) and the following wet cleaning process or the like. The RIE and the wet cleaning or the like may roughen or damage the processed surface of the insulating film, thus adversely affecting the quality of the semiconductor device. Particularly, this tendency is significant for an insulating film having a lower density in response to the recent request for the lower dielectric constant (Low-k) of the insulating film and for an insulating film including a silicon oxide film added with a methyl group or the like. For example, the rough surface may cause a step disconnection of the barrier metal and thus degrade the interconnection reliability. The damage to the surface such as a methyl group elimination may further roughen the surface or increase the surface hygroscopicity in the cleaning process. The higher hygroscopicity may increase the dielectric constant and thus degrade the device characteristics. The damage may also cause metal corrosion and thus reduce the interconnection reliability.

To solve the issues, various methods have been proposed to use repair materials to recover the insulating films that are roughened or damaged or the like. For example, a surface-hydrophobicization composition as the repair material is brought into contact with the damaged layer by application by spin coating or evaporation by vacuum deposition. The composition may provide a hydrophobic film for recovery of the damaged surface (see, JP 2006-104418). The recovery film formation process by application by spin coating or vacuum deposition by evaporation may not, however, sufficiently planarize the damaged layer. This is for the following reasons. The film formation process may supply excessive repair materials resulting in residuals that may degrade the shape and the performance of the semiconductor device. In addition, a thin recovery film may reflect the asperity of the damaged layer or the like on the recovered surface.

SUMMARY OF THE INVENTION

A method of manufacturing a semiconductor device according to one embodiment of the present invention comprises: providing an insulating film formed above a semiconductor substrate with a processed portion; supplying a surface of the processed portion of the insulating film with a primary reactant from a reaction of a raw material including at least a Si-containing compound; and subjecting the primary reactant to dehydration condensation to form an silicon oxide film on the surface of the processed portion.

DETAILED DESCRIPTION OF THE EMBODIMENTS

First Embodiment

Figure 1:
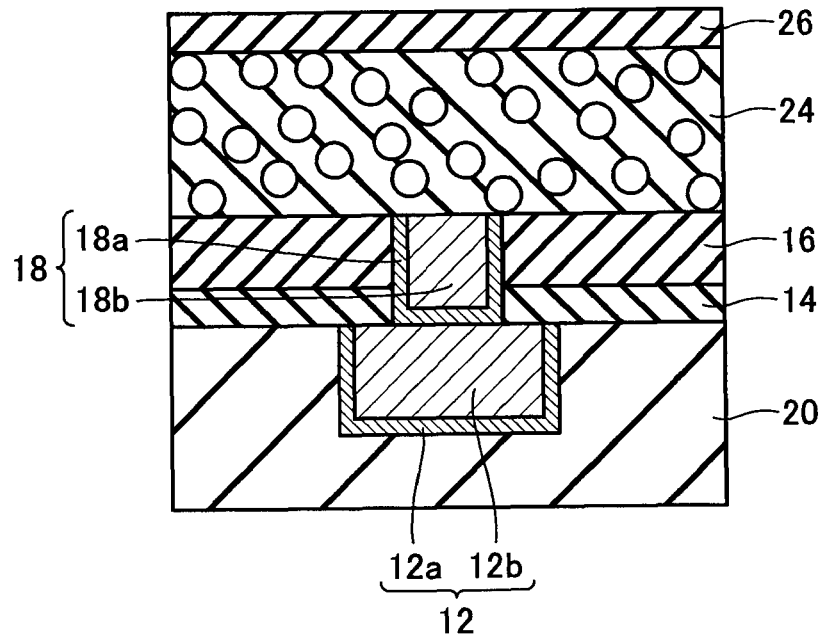
FIG. 1 is a cross sectional view of a semiconductor device before it is not processed using a method of manufacturing a semiconductor device according to a first embodiment of the present invention.
Figure 2:
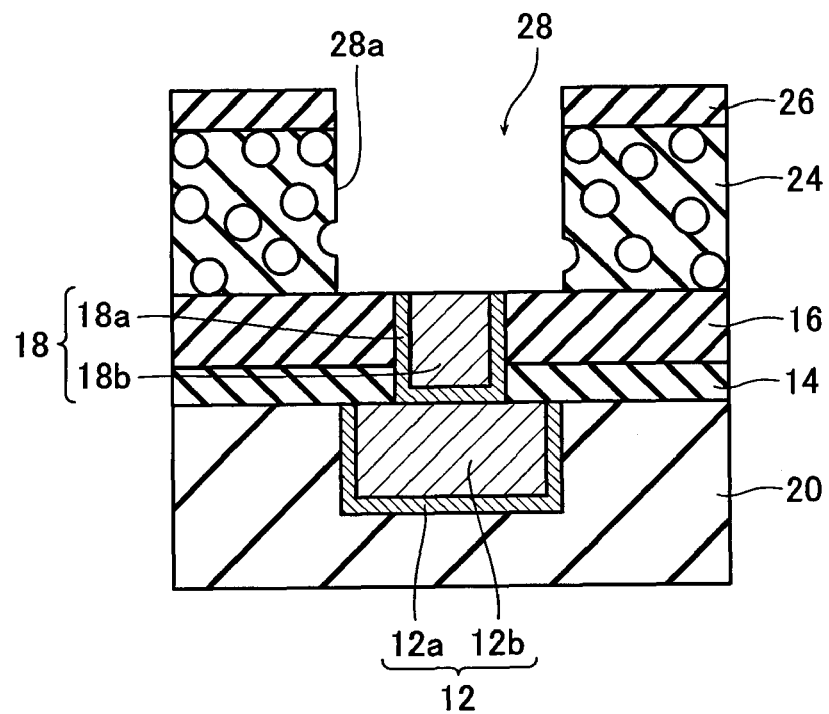
FIG. 2 is a cross sectional view of a semiconductor device before it is recovered using the method of manufacturing a semiconductor device of the first embodiment.

A method of manufacturing a semiconductor device according to a first embodiment of the present invention will be described with reference to the accompanying drawings. With reference to FIG. 1, a not-shown semiconductor substrate is provided with a lower interconnection layer 20 formed thereon. The interconnection layer 20 is provided with an interconnection 12 formed therein. The interconnection 12 includes a barrier metal 12a and Cu 12b. The interconnection layer 20 is provided with a SiCN film 14 and a silicon oxide film 16 laminated thereon. The oxide layer 16 is provided with a via 18 formed therein. The via 18 includes a barrier metal 18a and Cu 18b. Formed on the surface of the layer 16 is a porous organic Low-k film 24 having a relative dielectric constant k=2.5 and pores having an average pore diameter of 2.5 nm. The film 24 is provided with a silicon oxide film 26 as a cap formed thereon. The surface of the cap 26 is then applied with a resist. The resist is exposed, developed, and subjected to RIE and wet cleaning processes, thereby forming an interconnection groove 28 as shown in FIG. 2. A surface 28a of the interconnection groove 28 as a processed portion has a rough and non-smooth shape with pores of the porous organic Low-k film 24 exposed thereon.

Figure 3:
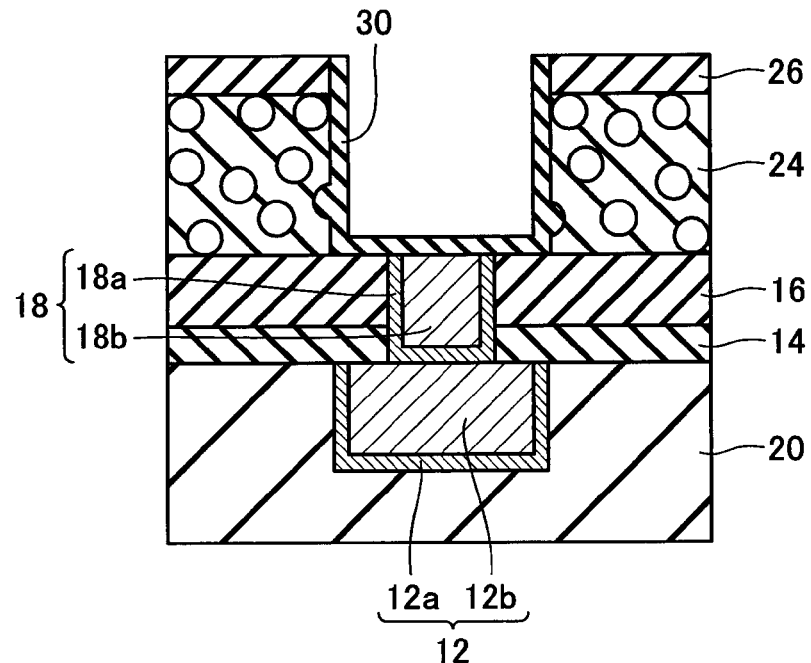
FIG. 3 is a cross sectional view of a semiconductor device that is recovered using the method of manufacturing a semiconductor device of the first embodiment.

The method of manufacturing a semiconductor device of the first embodiment forms a silicon oxide film 30 on the surface of the processed portion 28a by condensation CVD. The film 30 planarizes the rough and non-smooth shape with pores exposed thereon as shown in FIG. 3.

The condensation CVD generally forms a silicon oxide film as follows. The CVD process uses a Si-containing compound and an oxygen-source material as raw materials. The Si-containing compound may include silane ($SiH_4$) or organic silane such as tetraethoxysilane (TEOS) or methylsilane. The oxygen-source material may include hydrogen peroxide ($H_2O_2$) or an ozone gas. Using the raw materials, the process produces fluid silanol on the semiconductor substrate. The process then subjects the product to dehydration condensation, thereby forming a silicon oxide film.

The method of manufacturing a semiconductor device of the first embodiment may be performed as follows. A semiconductor substrate is set in a chamber (not shown). The substrate is then cooled to, for example, about −10° C. to 15° C. in the chamber. The raw materials of the condensation CVD are supplied to the chamber. The first embodiment uses trimethylsilane ($SiH(CH_3)_3$) and oxygen as the raw materials of the condensation CVD. A mixed gas of the raw materials is activated by a discharge in a reaction chamber (not shown). The reaction chamber is different from the chamber that contains the semiconductor substrate. The activated gas is then supplied to the chamber containing the semiconductor substrate. The raw materials react and thus form silanol as a primary reactant. Silanol adheres to the surface of the cooled semiconductor substrate. Silanol adhering to the surface may be very fluid at about −10° C. to 15° C. to which the semiconductor substrate is cooled. Silanol may thus be embedded even in narrow recesses. Because of silanol's surface tension, a thin film of silanol may sufficiently planarize the insulating film surface. When during the processing process, the porous organic Low-k film 24 has a damaged layer by having an organic group eliminated therefrom and converted to an OH group, silanol performs a dehydration condensation reaction and thus couples with the insulating film, and forms a recovery layer that has a methyl group on its surface, thus recovering the damaged layer. A vacuum heating process (curing process) is then performed at for example 350° C. in the chamber. The process facilitates the dehydration condensation reaction as shown by the expression 1. The reaction forms the silicon oxide film 30. The film 30 planarizes the rough surface of the processed portion 28a with the pores exposed thereon. The film thickness of the silicon oxide film 30 is adjusted to around 10 nm by controlling the supply of the raw materials.

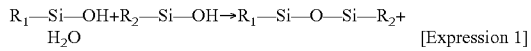
[Expression 1]

Figure 4:
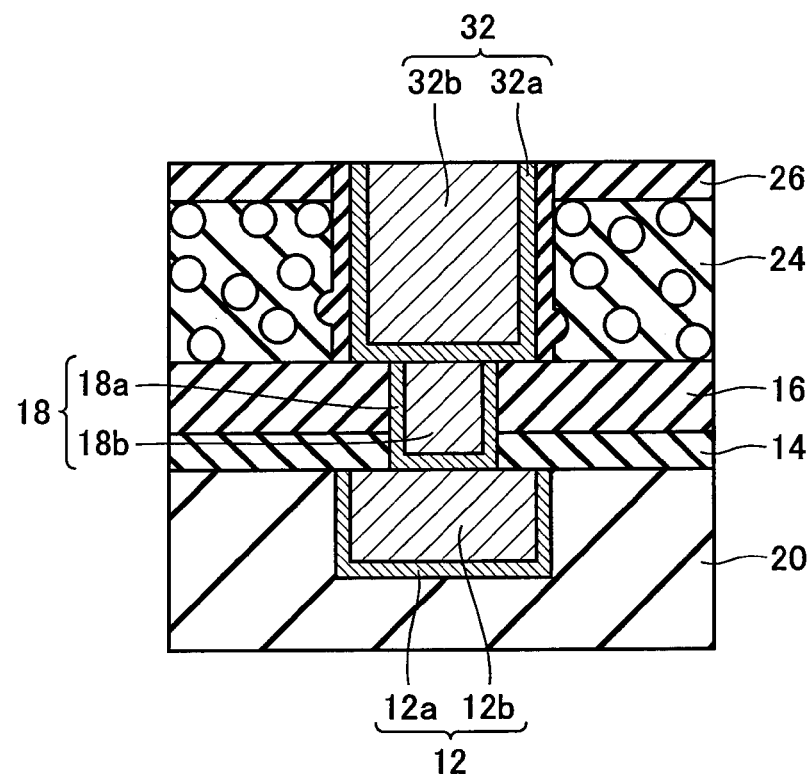
FIG. 4 is a cross sectional view of a semiconductor device that is recovered using the method of manufacturing a semiconductor device of the first embodiment and is provided with an interconnection.

The silicon oxide film formed on the groove bottom by condensation CVD is then sputtered away. A barrier metal 32a and a Cu seed film are then formed on the surface. Cu 32b is then embedded entirely in the interconnection groove 28 by plating. Extra Cu on the insulating film is removed by CMP. An interconnection 32 is thus formed as shown in FIG. 4.

Although in the first embodiment, trimethylsilane and oxygen are used as the raw materials of the condensation CVD, the invention is not limited thereto. Other Si-containing compounds and oxygen-source materials may also be used. In the first embodiment, the raw materials of the condensation CVD are activated in a reaction chamber different from the chamber containing the semiconductor substrate, and the activated compounds are supplied in the vicinity of the surface of the processed portion of the porous organic Low-k film. Alternatively, the raw materials may be supplied in the vicinity of the semiconductor substrate in the chamber and then be activated. Additionally, when the raw materials are both highly reactive, they may not be activated. Although in the first embodiment, the porous organic Low-k film is the insulating film in which the surface of the processed portion is planarized and recovered, the invention is not limited thereto. Other insulating films such as an organic silicon oxide film may also be recovered and planarized.

Thus, according to the method of manufacturing a semiconductor device of the first embodiment, very fluid silanol adheres to the surface of the processed portion. Silanol may thus be embedded even in narrow recesses. Because of silanol's surface tension, a thin film of silanol may sufficiently planarize the insulating film surface. Also according to the method of manufacturing a semiconductor device of the first embodiment, silanol is in liquid form and thus has less permeability and diffusibility than gases, so it hardly fills the inside of the insulating material. Additionally, according to the method of manufacturing a semiconductor device of the first embodiment, the primary reactant from the raw materials is supplied to the surface of the processed portion. The primary reactant may recover the damaged layer on the surface of the processed portion with higher recoverability than the conventional repair materials.

Second Embodiment

Figure 5:
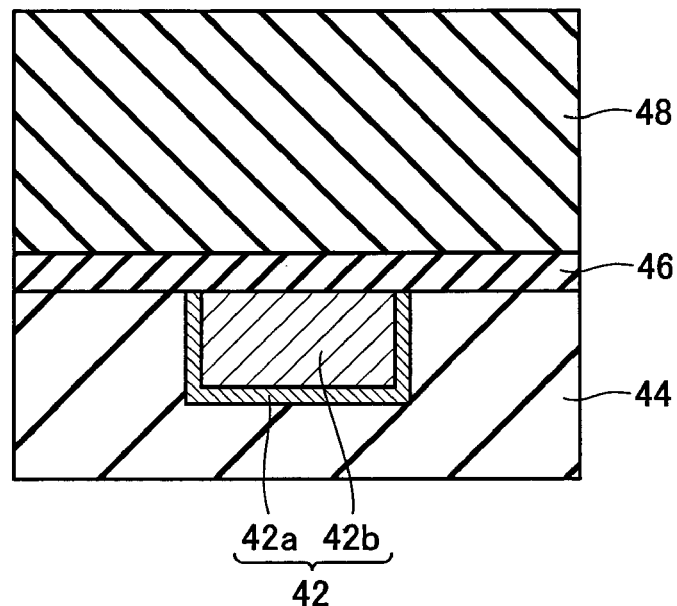
FIG. 5 is a cross sectional view of a semiconductor device before it is processed using a method of manufacturing a semiconductor device according to a second embodiment of the present invention.

A method of manufacturing a semiconductor device according to a second embodiment of the present invention will now be described with reference to the accompanying drawings. In the method of manufacturing a semiconductor device of the second embodiment, a compound having a hydroxyl group is allowed to adhere to the surface of the processed portion in a liquid state and then the primary reactant from the raw materials is supplied. With reference to FIG. 5, first, a not-shown semiconductor substrate is provided with a lower interconnection layer 44 formed thereon. The interconnection layer 44 is provided with an interconnection 42 formed therein. The interconnection 42 includes a barrier metal 42a and Cu 42b. The interconnection layer 44 is provided with a SiCN film 46 and a silicon oxide film 48 formed thereon. The SiCN film 46 serves as a Cu diffusion barrier film. The silicon oxide film 48 of k=2.5 has a methyl group. The surface of the film 48 is then applied with a resist. The resist is exposed, developed, and subjected to RIE resist ashing and wet cleaning processes. The whole process is done twice to form a via hole 50 and an interconnection groove 52.

Figure 6:
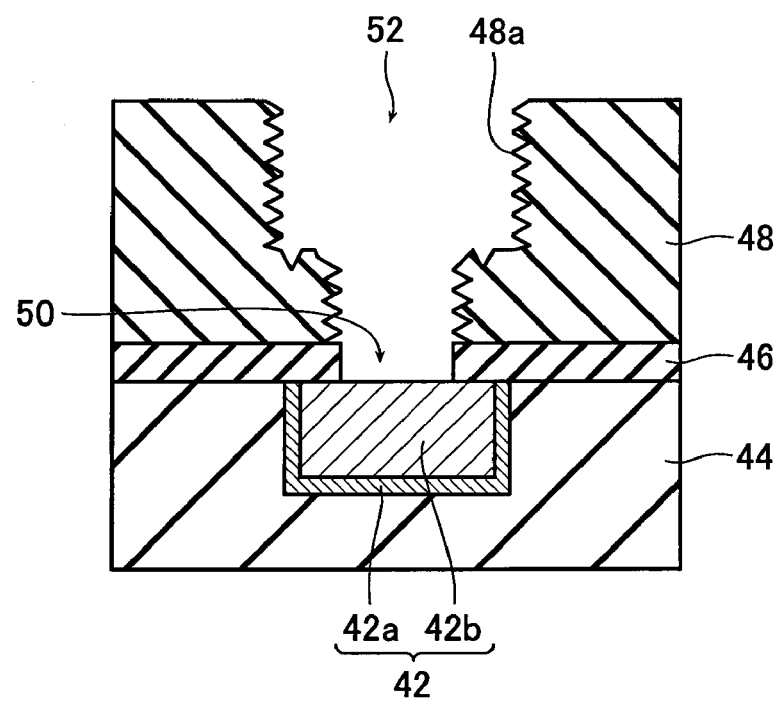
FIG. 6 is a cross sectional view of a semiconductor device before it is recovered using the method of manufacturing a semiconductor device of the second embodiment.
Figure 7:
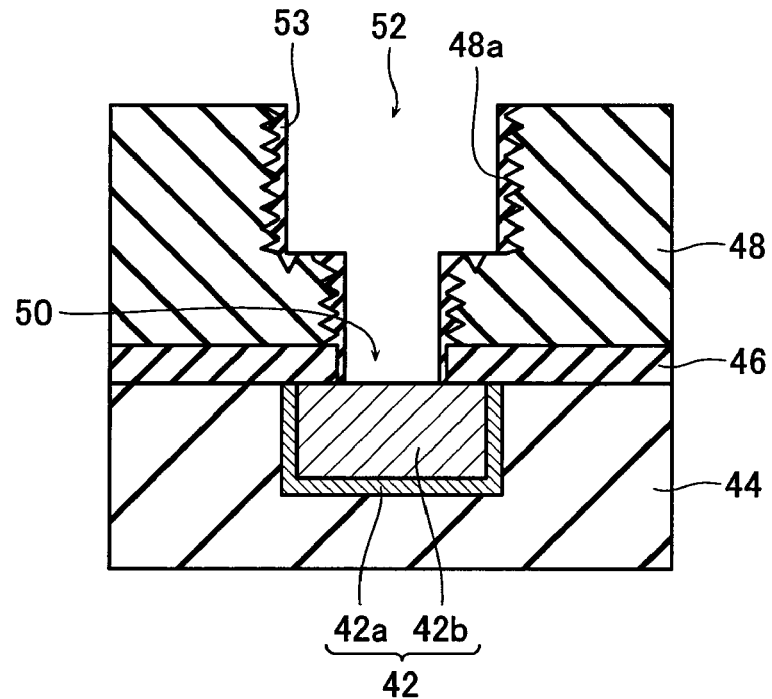
FIG. 7 is a cross sectional view of a semiconductor device that is recovered using the method of manufacturing a semiconductor device of the second embodiment.

With reference to FIG. 6, mainly due to the RIE and resist ashing, a methyl group in the vicinity of the surface of the processed portion 48a of the silicon oxide film 48 is eliminated and converted to a Si—OH group having hygroscopicity. Additionally, mainly due to the wet cleaning, a portion of the damaged layer with the methyl group eliminated therefrom is dissolved. A rough surface thus occurs. The method of manufacturing a semiconductor device of the second embodiment forms a silicon oxide film 53 on the surface of the processed portion 48a by condensation CVD as shown in FIG. 7. The film 53 may recover and planarize the damaged layer of the via hole 50 and the interconnection groove 52.

In the second embodiment, first, the semiconductor substrate contained in the chamber is cooled to, for example, about −10° C. to 15° C., and a compound having a hydroxyl group such as water vapor is supplied to the chamber. The water molecules of the supplied water vapor are preferentially adsorbed around the hydrophilic silanol groups that are formed by damage. The adsorbed water has the nature of fluidity as liquid and surface tension. The water may thus be embedded in recesses and thus form a flat water film on the rough surface. Then, the semiconductor substrate is cooled to, for example, about −10° C. to 15° C., while the raw materials of the condensation CVD is supplied to the chamber. The second embodiment uses trimethylsilane and oxygen as the raw materials of the condensation CVD. A mixed gas of the raw materials is activated by a discharge in, for example, a reaction chamber adjacent to the chamber containing the semiconductor substrate. The activated gas is then supplied to the chamber containing the semiconductor substrate. The raw materials react and thus form silanol as a primary reactant. Silanol has a hydrophilic hydroxyl group (OH) and thus dissolves in the water film deposited on the insulating film surface. Unreacted trimethylsilane has lower solubility and does not dissolve in the water film. Dissolved silanol then undergoes an exhaust process, a thermal treatment process, and a dehydration condensation reaction, thus coupling with the insulating film. This may form a recovery layer that has a methyl group on its surface. The recovery layer may recover the damaged layer. Silanol dissolved in the water film forms the recovery layer and extra supplied silanol is exhausted, thus forming no excessive deposit. Because silanol is very fluid, a thin recovery film of silanol may sufficiently planarize the insulating film surface due to silanol's surface tension. A reliable semiconductor device may thus be manufactured without an increase in the interconnection resistance.

Figure 8:
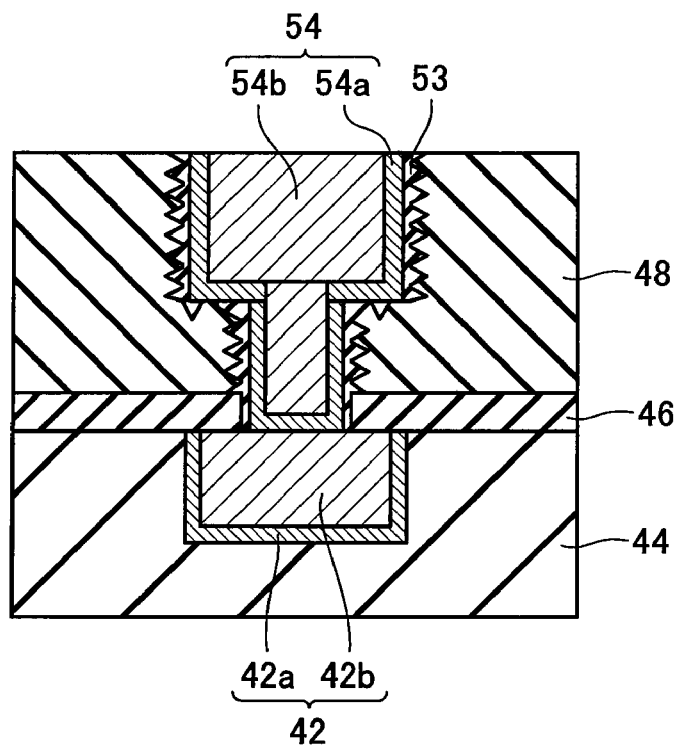
FIG. 8 is a cross sectional view of a semiconductor device that is recovered using the method of manufacturing a semiconductor device of the second embodiment and is provided with an interconnection.

A barrier metal 54*a* and a Cu seed film are then formed. Cu 54*b* is then embedded entirely in the via hole 50 and the interconnection groove 52 by plating. Extra Cu on the insulating film is removed by CMP. An interconnection 54 is thus formed as shown in FIG. 8.

Although in the second embodiment, trimethylsilane and oxygen are used as the raw materials of the condensation CVD, the invention is not limited thereto. Other Si-containing compounds and oxygen-source materials may also be used. In the second embodiment, the raw materials of the condensation CVD are activated in a reaction chamber different from the chamber containing the semiconductor substrate, and the activated compounds are supplied in the vicinity of the surface of the processed portion of the silicon oxide film. Alternatively, the raw materials may be supplied in the vicinity of the semiconductor substrate in the chamber and then be activated. Additionally, when the raw materials are both highly reactive, they may not be activated. Although in the second embodiment, water vapor is supplied to the chamber containing the semiconductor substrate before the raw materials are supplied, the invention is not limited thereto. Any compound having a hydroxyl group that may adhere to the semiconductor substrate surface in a liquid state may also be used. An example of the compound includes an organic solvent having a hydroxyl group, such as alcohol. Although in the second embodiment, the silicon oxide film is the insulating film that is recovered, the invention is not limited thereto. Other insulating films such as the porous organic Low-k film may also be recovered and planarized.

Thus, according to the method of manufacturing a semiconductor device of the second embodiment, very fluid silanol adheres to the surface of the processed portion. Silanol may thus be embedded even in narrow recesses and recover them. Because of silanol's surface tension, a thin recovery film of silanol may sufficiently planarize the insulating film surface. Also according to the method of manufacturing a semiconductor device of the second embodiment, silanol is in liquid form and thus has less permeability and diffusibility than gases, so it hardly fills the inside of the insulating material. According to the method of manufacturing a semiconductor device of the second embodiment, a compound having a hydroxyl group in a liquid state is preferentially adsorbed around the hydrophilic silanol groups which have been formed by damage. The absorbed compound may intensively recover the damaged portions of the surface of the insulating film or the like. According to the method of manufacturing a semiconductor device of the second embodiment, only silanol dissolved in the compound having a hydroxyl group may form the silicon oxide film used for recovery, and undissolved extra silanol and the unreacted Si-containing compound may not contribute to the formation of the silicon oxide film. The supply of the compound having a hydroxyl group may thus be adjusted to easily adjust the film thickness of the silicon oxide film used for recovery. Additionally, according to the method of manufacturing a semiconductor device of the second embodiment, the primary reactant from the raw materials is supplied to the surface of the processed portion. The primary reactant may provide higher recoverability than the conventional repair materials.

Third Embodiment

Figure 9:
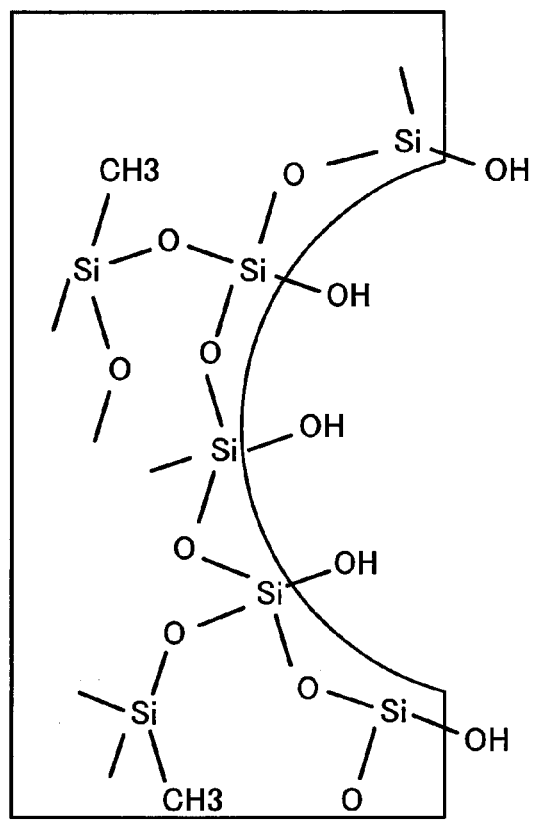
FIG. 9 is an enlarged schematic diagram of an insulating film before it is recovered using a method of manufacturing a semiconductor device according to a third embodiment of the present invention.

A method of manufacturing a semiconductor device according to a third embodiment of the present invention will now be described. In the method of manufacturing a semiconductor device of the third embodiment, an oxygen-source material is allowed to adhere to the surface of the processed portion in a liquid state, and the Si-containing compound is then reacted with the oxygen-source material on the insulating film, thereby providing silanol. In the method of manufacturing a semiconductor device of the third embodiment, like the second embodiment, the surface of the processed portion of the semiconductor substrate having a via hole and an interconnection groove formed therein is recovered by planarization by condensation CVD. FIG. 9 is an enlarged schematic diagram of a silicon oxide film having a damage or the like. With reference to FIG. 9, the methyl groups are eliminated from the silicon oxide film and are converted to silanol (Si—OH) groups having hygroscopicity.

Figure 10:
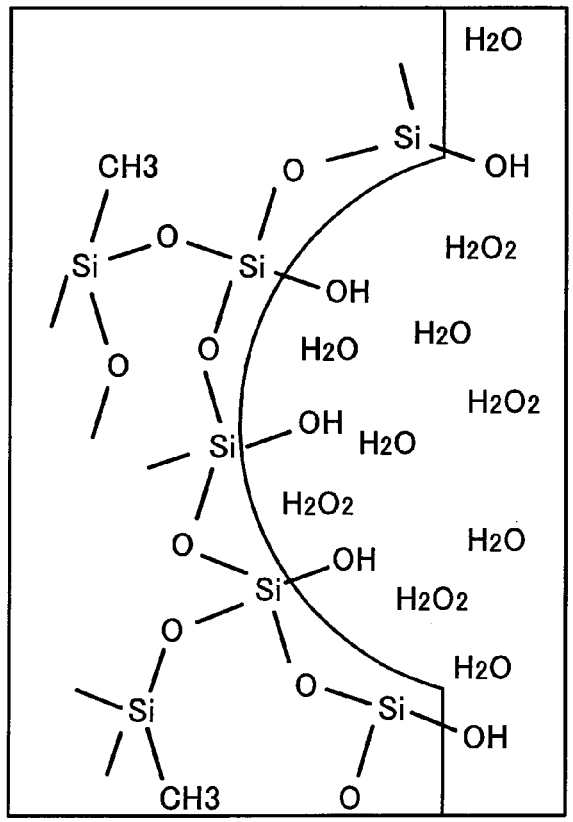
FIG. 10 is an enlarged schematic diagram of an insulating film being recovered using the method of manufacturing a semiconductor device of the third embodiment.
Figure 11:
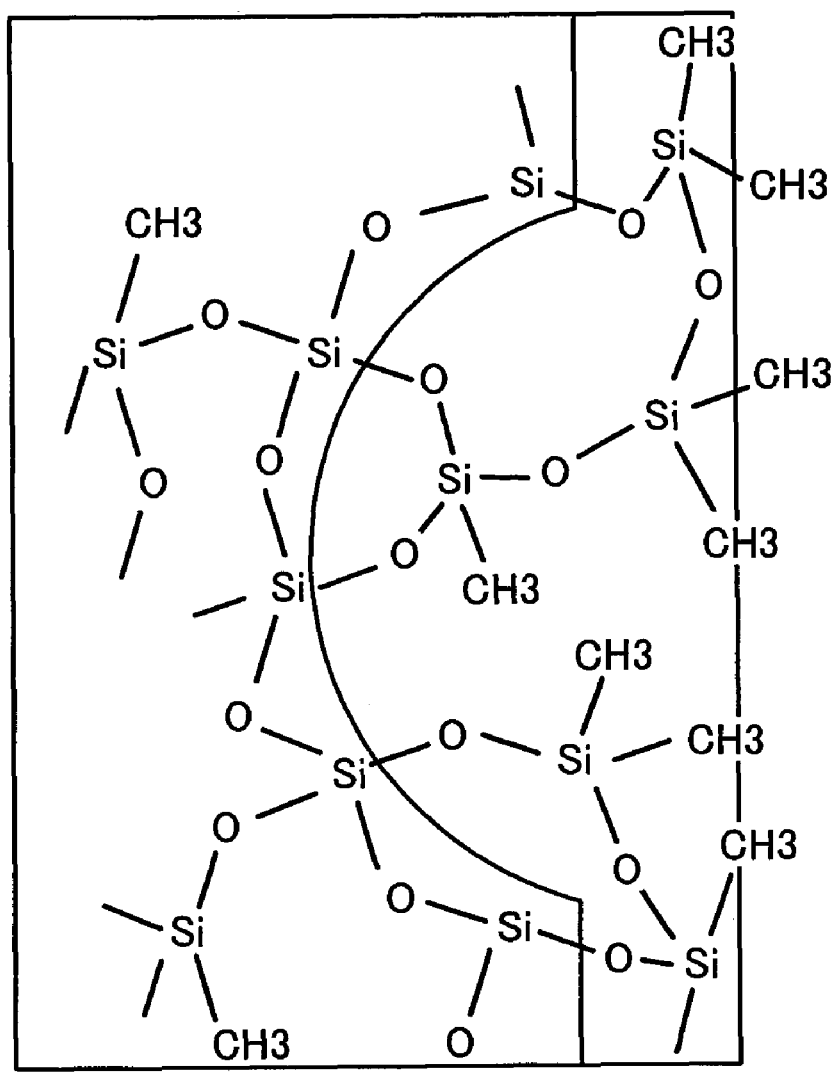
FIG. 11 is an enlarged schematic diagram of an insulating film that is recovered using the method of manufacturing a semiconductor device of the third embodiment.

The method of manufacturing a semiconductor device of the third embodiment may be performed as follows. A semiconductor substrate is set in a chamber. The substrate is then cooled to, for example, about −10° C. to 15° C. in the chamber. A hydrogen peroxide solution ($H_2O_2+H_2O$) is supplied in the chamber. With reference to FIG. 10, the supplied hydrogen peroxide solution is preferentially adsorbed around the hydrophilic silanol groups that are formed by damage. The adsorbed hydrogen peroxide solution has fluidity and surface tension and may thus be embedded in recesses, thus forming a flat liquid film on the rough surface. After the supply of the hydrogen peroxide solution is stopped, the semiconductor substrate continues to be cooled to, for example, about −10° C. to 15° C., while a mixed gas of monomethylsilane ($SiH_3CH_3$) and dimethylsilane ($SiH_2(CH_3)_2$) is supplied to the chamber. Monomethylsilane and dimethylsilane come into contact with the liquid film of the hydrogen peroxide solution and react with the oxidative hydrogen peroxide, thus forming the silanol groups. The silanol groups then dissolve in the liquid film. The dehydration condensation reaction then occurs between silanols formed from monomethylsilane and dimethylsilane or between silanol and the silanol groups formed in the vicinity of the Low-k film surface by damage. The dehydration condensation reaction forms a siloxane (Si—O) coupling to be recovered as shown in FIG. 11. Because silanol is very fluid and thus has a surface tension, a thin recovery film of silanol may sufficiently planarize the insulating film surface. The formation of the siloxane coupling may be accelerated by heating the substrate to, for example, 50° C. to 450° C. after silanol is deposited.

In the third embodiment, hydrogen peroxide, which has fluidity and the nature of being preferentially adsorbed on the hydrophilic surface, is first supplied and then monomethylsilane and dimethylsilane forming the recovery material are supplied. This may preferentially planarize the uneven surface of the damaged processed portion and form a hydrophobic recovered surface. Additionally, the reaction is stopped when the hydrogen peroxide solution deposited on the surface is consumed, thereby decreasing the reduction of the holes and grooves due to the deposition of the excessive recovery material. Then, like the second embodiment, the barrier metal and the Cu seed film are formed, Cu is entirely embedded in the interconnection groove by plating, and extra Cu on the insulating film is removed by CMP. The interconnection is thus formed.

Although in the third embodiment, hydrogen peroxide solution is used as the oxygen-source material included in the raw materials of the condensation CVD, the invention is not limited thereto. Other oxygen-source materials may also be used. Although in the third embodiment, the mixture of monomethylsilane and dimethylsilane is used as the Si-containing compound, the invention is not limited thereto. The compounds may also be used alone and other Si-containing compounds may also be used. Additionally, although in the third embodiment, the silicon oxide film is the insulating film that is recovered, the invention is not limited thereto. Other insulating films such as the porous organic Low-k film may also be recovered and planarized.

Thus, according to the method of manufacturing a semiconductor device of the third embodiment, very fluid silanol adheres to the surface of the processed portion. Silanol may be embedded in even narrow recesses and recover them. Because of silanol's surface tension, a thin recovery film of silanol may sufficiently planarize the insulating film surface. Also according to the method of manufacturing a semiconductor device of the third embodiment, silanol is in liquid form and thus has less permeability and diffusibility than gases, so it hardly fills the inside of the insulating material. Also according to the method of manufacturing a semiconductor device of the third embodiment, the oxygen-source material in a liquid state is preferentially adsorbed around the hydrophilic silanol groups which have been formed by damage. The absorbed compound may intensively recover the damaged portions of the surface of the insulating film or the like. According to the method of manufacturing a semiconductor device of the third embodiment, only the Si-containing compound that reacts with the oxygen-source material and thus contributes to the formation of silanol may form the silicon oxide film used for recovery, and the Si-containing compound that does not contribute to the reaction may not contribute to the formation of the silicon oxide film. The supply of the oxygen-source material may thus be adjusted to easily adjust the film thickness of the silicon oxide film used for recovery. Additionally, according to the method of manufacturing a semiconductor device of the third embodiment, the primary reactant from the raw materials is supplied to the surface of the processed portion. The primary reactant may provide higher recoverability than the conventional repair materials.

What is claimed is:

1. A method of manufacturing a semiconductor device, comprising:
    providing an insulating film formed above a semiconductor substrate with a processed portion;
    supplying an oxygen-source material to adhere to a surface of the processed portion of the insulating film in a liquid state to form a liquid film and, after the supply of the oxygen-source material is stopped, supplying a Si-containing compound to react the Si-containing compound with the oxygen-source material on the surface of the processed portion to supply a fluid silanol from a reaction of a raw material including at least the Si-containing compound and the oxygen-source material; and
    subjecting the fluid silanol to dehydration condensation to form a silicon oxide film on the surface of the processed portion.

2. The method of manufacturing a semiconductor device according to claim 1, wherein
    the oxygen-source material is a hydrogen peroxide solution.

3. The method of manufacturing a semiconductor device according to claim 1, wherein
    the semiconductor substrate is set at $-10°$ C. to $15°$ C. while the Si-containing compound is reacted with the oxygen-source material.

4. The method of manufacturing a semiconductor device according to claim 1, wherein
    the processed portion is at least one of a via hole and an interconnection groove.

5. The method of manufacturing a semiconductor device according to claim 1, wherein
    a portion of the insulating film has been processed to form a processed portion including at least one of a via hole and an interconnection groove, the processed portion having a damaged inner surface.

* * * * *